United States Patent [19]

Chishiki

[11] Patent Number: 5,714,796
[45] Date of Patent: Feb. 3, 1998

[54] INTEGRATED CIRCUIT DEVICE FABRICATED ON SEMICONDUCTOR SUBSTRATE BLOCKING POWER SUPPLY LINES FROM NOISE

[75] Inventor: Shigeo Chishiki, Tokyo, Japan

[73] Assignee: NEC Corporation, Tokyo, Japan

[21] Appl. No.: 796,213

[22] Filed: Feb. 7, 1997

Related U.S. Application Data

[63] Continuation of Ser. No. 554,664, Nov. 8, 1995, abandoned, which is a continuation of Ser. No. 205,099, Mar. 3, 1994, abandoned.

[30] Foreign Application Priority Data

Mar. 3, 1993 [JP] Japan ................... 5-041637

[51] Int. Cl.$^6$ .................... H01L 29/00; H01L 29/76
[52] U.S. Cl. .................... 257/544; 257/371; 257/373
[58] Field of Search .................... 257/371, 373, 257/351, 213, 69, 195, 204, 206, 338, 350, 357, 358, 359, 365, 377

[56] References Cited

U.S. PATENT DOCUMENTS

| | | | |
|---|---|---|---|
| 4,878,096 | 10/1989 | Shirai et al. | 257/371 |
| 5,148,255 | 9/1992 | Nakazato et al. | |
| 5,157,281 | 10/1992 | Santin et al. | 257/371 |
| 5,281,842 | 1/1994 | Yasuda et al. | 257/371 |
| 5,336,915 | 8/1994 | Fujita et al. | 257/371 |
| 5,374,838 | 12/1994 | Sawada et al. | 257/371 |
| 5,404,042 | 4/1995 | Okumura et al. | 257/373 |

FOREIGN PATENT DOCUMENTS

| | | | |
|---|---|---|---|
| 3-76029 | 5/1983 | Japan. | |
| 61-245563 | 10/1986 | Japan. | |
| 62-285463 | 12/1987 | Japan | 257/371 |
| 2-272761 | 11/1990 | Japan. | |
| 3-239359 | 10/1991 | Japan | 257/371 |
| 4-239178 | 8/1992 | Japan | 257/371 |
| 4-245471 | 9/1992 | Japan | 257/371 |

OTHER PUBLICATIONS

"Techniques for Latch–up Analysis in CMOS IC's based on Scanning Electron Microscopy", by C. Canali, Microelectronics & Reliability, vol. 28, No. 1, pp. 119–161, 1988.

"A 45–ns 16–Mbit DRAM with Triple–Well Structure", by S. Fujii et al., Journal of Solid–State Circuits, vol. 24, No. 5 Oct. 1989.

*Primary Examiner*—Carl W. Whitehead
*Attorney, Agent, or Firm*—Sughrue, Mion, Zinn, Macpeak & Seas, PLLC

[57] ABSTRACT

An output driver is implemented by a complementary inverter circuit responsive to an output data signal for selectively charging and discharging an external capacitive load, and the complementary inverter circuit has a p-channel enhancement type field effect transistor formed in an n-type well defined in a p-type silicon substrate reversely biased and an n-channel enhancement type field effect transistor formed in a p-type well nested with a reversely biased n-type well defined in the p-type silicon substrate in spacing relation to the n-type well assigned to the p-channel enhancement type field effect transistor, thereby perfectly isolating the p-channel enhancement type field effect transistor from a noise propagated from a ground voltage line to the p-type well assigned to the n-channel enhancement type field effect transistor.

9 Claims, 6 Drawing Sheets

5,714,796

INTEGRATED CIRCUIT DEVICE FABRICATED ON SEMICONDUCTOR SUBSTRATE BLOCKING POWER SUPPLY LINES FROM NOISE

This is a Continuation of application Ser. No. 08/554,664 filed on Nov. 8, 1995, now abandoned which is a Continuation of application Ser. No. 08/205,099 filed Mar. 3, 1994 now abandoned.

FIELD OF THE INVENTION

This invention relates to an integrated circuit device and, more particularly, to an integrated circuit fabricated on a semiconductor substrate blocking power supply lines from a noise.

DESCRIPTION OF THE RELATED ART

A typical example of the integrated circuit device is illustrated in FIG. 1 of the drawings, and is fabricated on a lightly doped p-type silicon substrate 1. In this instance, two complementary inverter circuits 2 and 3 are respectively assigned to separate two pairs of active areas 4 and 5 defined in a major surface of the silicon substrate 1.

An n-type well 6 is formed in one of the active areas 4, and a p-type source region 7a, a p-type drain region 7b, a gate oxide film 7c and a gate electrode 7d form a p-channel enhancement type field effect transistor 7. An n-type source region 8a an n-type drain region 8b are formed in the lightly doped p-type silicon substrate of the other of the active areas 4 in spacing relation, and the n-type source region 8a, the n-type drain region 8b, a gate oxide film 8c and a gate electrode 8d as a whole constitute an n-channel enhancement type field effect transistor 8. Two input nodes 9a and 9b of the complementary inverter circuit 2 are respectively connected with the gate electrodes 8d and 7d, and an output node 9c is connected with the p-type drain region 7b and with the n-type drain region 8b. The p-type source region 7a is connected with a positive power voltage line Vdd, and a ground voltage line GND is connected with the n-type source region 8a.

The n-type well 6 further has a heavily doped p-type contact region 7e, and a positive power voltage line Vdd biases the n-type well 6 through the heavily doped p-type contact region 7e. Similarly, a heavily doped n-type contact region 8e is formed in the lightly doped p-type silicon substrate 1, and the lightly doped p-type silicon substrate 1 is grounded through a ground voltage line GND.

The p-channel enhancement type field effect transistor 7 and the n-channel enhancement type field effect transistor 8 are large-sized, and, accordingly, the complementary inverter circuit 2 has a large current driving capability. For this reason, the complementary inverter circuit 2 is usually used as an output driver of the integrated circuit, and the output node 9c is connected with a pad 14 as shown in FIG. 2.

In-phase output data signals S1 and S2 are applied to the gate electrodes 7d and to the gate electrode 8d, and the p-channel enhancement type field effect transistor 7 and the n-channel enhancement type field effect transistor 8 complementarily turn on and off so as to drive a load LC coupled with the pad 14.

Turning back to FIG. 1, the complementary inverter circuit 3 is also implemented by a series of a p-channel enhancement type field effect transistor 10 and an n-channel enhancement type field effect transistor 11. An n-type well 12 is formed in one of the active areas 5, and a p-type source region 10a, a p-type drain region 10b, a gate oxide film 10c and a gate electrode 10d form the p-channel enhancement type field effect transistor 10. An n-type source region 11a an n-type drain region 11b are formed in the lightly doped p-type silicon substrate 1 of the other of the active areas 5, and are spaced from each other. The n-type source region 11a and the n-type drain region 11b form the n-channel enhancement type field effect transistor 11 together with a gate oxide film 11c and a gate electrode 11d. An input node 13a of the complementary inverter circuit 3 is shared between the gate electrodes 10d and 11d, and an output node 13b is connected with the p-type drain region 10b and with the n-type drain region 11b. The p-type source region 10a is connected with the positive power voltage line Vdd, and the ground voltage line GND is connected with the n-type source region 11a.

The n-type well 12 further has a heavily doped p-type contact region 10e, and the positive power voltage line Vdd biases the n-type well 12 through the heavily doped p-type contact region 10e. Similarly, a heavily doped n-type contact region 11e is formed in the lightly doped p-type silicon substrate 1, and the lightly doped p-type silicon substrate 1 is grounded further through the heavily doped n-type contact region 11e.

The p-channel enhancement type field effect transistor 10 and the n-channel enhancement type field effect transistor 11 are smaller in size than those of the complementary inverter circuit 2, and the complementary inverter circuit 3 forms a part of a logic circuit 15 of the integrated circuit as shown in FIG. 3.

An input signal Sin is applied to the gate electrodes 10d and 11d of the field effect transistors 10 and 11, and the p-channel enhancement type field effect transistor 10 and the n-channel enhancement type field effect transistor 11 complementarily turn on and off so as to produce an output signal Sout. The logic circuit 15 produces the in-phase output data signals S1 and S2, and supplies them to the complementary inverter circuit 2 serving as the output driver.

The positive power voltage level and the ground voltage level are supplied to a power voltage pin 16 and a ground pin 17, and the positive power voltage line Vdd and the ground voltage line GND distribute the positive power voltage and ground voltage to both of the logic circuit 15 and the complementary inverter circuit 2 as shown in FIG. 4. In other words, the positive power voltage line Vdd and the ground voltage line GND are shared between the logic circuit 15 and the complementary inverter circuit 2.

If the in-phase output data signal S1 and the complementary output data signal S2 simultaneously stay at the low voltage level, the p-channel enhancement type field effect transistor 7 turns on, and the n-channel enhancement type field effect transistor 8 turns off. As a result, the positive power voltage line Vdd supplies current through the p-channel enhancement type field effect transistor 7 to the load LC, and the n-channel enhancement type field effect transistor 8 cuts off the current.

However, if the load LC is very large, the positive power voltage line Vdd is transiently decayed due to the large amount of current flowing into the load LC. In this situation, if the complementary inverter circuit 3 produces the output signal Sout of the high voltage level by supplying current through the p-channel enhancement type field effect transistor 10, current flows from the output node 13b through the p-channel enhancement type field effect transistor 10 into the positive power voltage line Vdd, and the complementary inverter circuit 3 temporally changes the output signal Sout to the low voltage level. The output signal Sout of the low voltage level is latched by the next stage, and the logic circuit 15 finally changes the in-phase output data signals S1 and S2.

On the other hand, if the in-phase output data signals S1 and S2 simultaneously stay at the high voltage level, the p-channel enhancement type field effect transistor 7 turns off, and the n-channel enhancement type field effect transistor 8 turns on. As a result, the positive power voltage line Vdd is blocked by the p-channel enhancement type field effect transistor 7, and the n-channel enhancement type field effect transistor 8 discharges the load LC to the ground voltage line GND. This results in temporary voltage rise on the ground voltage line GND. In this situation, if the complementary inverter circuit 3 produces the output signal Sout of the low voltage level by connecting the output node 13b through the n-channel enhancement type field effect transistor 11 with the ground voltage line GND, the voltage rise on the ground voltage line GND temporally changes the output signal Sout to the high voltage level. The output signal Sout of the high voltage level is latched by the next stage, and the logic circuit 15 finally changes the in-phase output data signals S1 and S2.

Even if the load LC is not so large, the prior art integrated circuit device encounters the similar problem. Although the output data signals S1 and S2 are designed to be in-phase, the output data signal S1 may be decayed earlier than the decay of the output data signal S2 in a product, and the output data signals S1 and S2 transiently stay at the low and high levels. Then, through-current flows from the positive power voltage line Vdd through the complementary inverter circuit 2 into the ground voltage line GND, and positive power voltage line Vdd and the ground voltage line GND widely fluctuate. The voltage fluctuations on both voltage lines Vdd and GND disturb the complementary inverters 3 of the logic circuit 15, and the logic circuit 15 changes the level of the output data signals S1 and S2.

Thus, the power supply network shown in FIG. 4 propagates the voltage fluctuations to the logic circuit 15, and the malfunction is liable to take place in the logic circuit.

In order to prevent the logic circuit 15 from the voltage fluctuation at the complementary inverter circuit 2, the positive power voltage line Vdd and the ground voltage line GND may be dualized as shown in FIG. 5. Two power pins 16a and 16b and two ground pin 17a and 17b are provided for the prior art integrated circuit device, and the logic circuit 15 and the complementary inverter circuit 2 are independently supplied with the positive power voltage and the ground voltage.

The power supply network shown in FIG. 5 effectively cuts off the voltage fluctuation on the positive power voltage line Vdd. However, even if the two ground voltage lines GND independently propagate the ground voltage level to the logic circuit 15 and the complementary inverter circuit 2, the two ground voltage lines GND are electrically coupled through the heavily doped n-type contact regions 8e and 11e with the lightly doped p-type silicon substrate 1, and voltage rise on one of the ground voltage lines GND is transferred through the p-type silicon substrate 1 to the other of the ground voltage line GND, and the malfunction still takes place in the logic circuit 15.

In order to prevent the logic circuit 15 from the voltage rise on the ground voltage line GND, n-type wells 18a and 18b are respectively formed in the two pairs of active areas 4 and 5, and p-type wells 19a and 19b in turn are formed in the n-type wells 18a and 18b, respectively. The p-channel enhancement type field effect transistors 7 and 10 are respectively fabricated on the n-type wells 18a and 18b, and the n-channel enhancement type field effect transistors 8 and 11 are fabricated on the p-type wells 19a and 19b, respectively.

The prior art integrated circuit device shown in FIG. 6 can effectively prevent the p-type silicon substrate 1 from the voltage rise on the ground voltage line GND. Namely, even if the voltage rise propagated to the p-type well 19a lifts the voltage level in the n-type well 18a, the n-type well 18a is electrically isolated from the p-type silicon substrate 1 by means of the reversely biased p-n junction therebetween, and the complementary inverter circuit 3 of the logic circuit 15 is free from the voltage rise on the ground voltage line GND due to the discharge current through the n-channel enhancement type field effect transistor 8.

The dualized ground voltage line GND and the n-type well 18a establishes electrical isolation between the complementary inverter circuits 2 and 3. However, a problem is encountered in the semiconductor integrated circuit device in that the p-channel enhancement type field effect transistor 7 undesirably turns on. This results in that the output data signal is inverted in logic level.

SUMMARY OF THE INVENTION

It is therefore an important object of the present invention to provide a semiconductor integrated circuit device which is free from voltage fluctuations on power voltage lines.

The present inventor contemplated the problem, and concluded that the voltage rise in the p-type well 19a lifted the n-type well 18a capacitively coupled therewith so that the potential difference between the gate electrode 7d and the p-type source region 7a became smaller than the threshold of the p-channel enhancement type field effect transistor 7.

To accomplish the object, the present invention proposes to electrically isolate component transistors of a complementary inverter circuit from each other.

In accordance with the present invention, there is provided a semiconductor integrated circuit device, fabricated on a semiconductor substrate of a first conductivity type, comprising: a) a main circuit for producing an output data signal; b) a complementary inverter circuit responsive to said output data signal for selectively charging and discharging an external load, and having a first field effect transistor of a first channel conductivity type formed in a first well of a second conductivity type opposite to said first conductivity type, said first well being formed in said semiconductor substrate, and a second field effect transistor having a second channel conductivity type opposite to said first channel conductivity type, and formed in a second well of said first conductivity type nested in a third well of said second conductivity type, said third well being formed in said semiconductor substrate in spacing relation to said first well; and a first biasing means for reversely biassing said first and third wells with respect to said semiconductor substrate; and a second biasing means for reversely biasing said second well with respect to said third well.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENT

Figure 1:
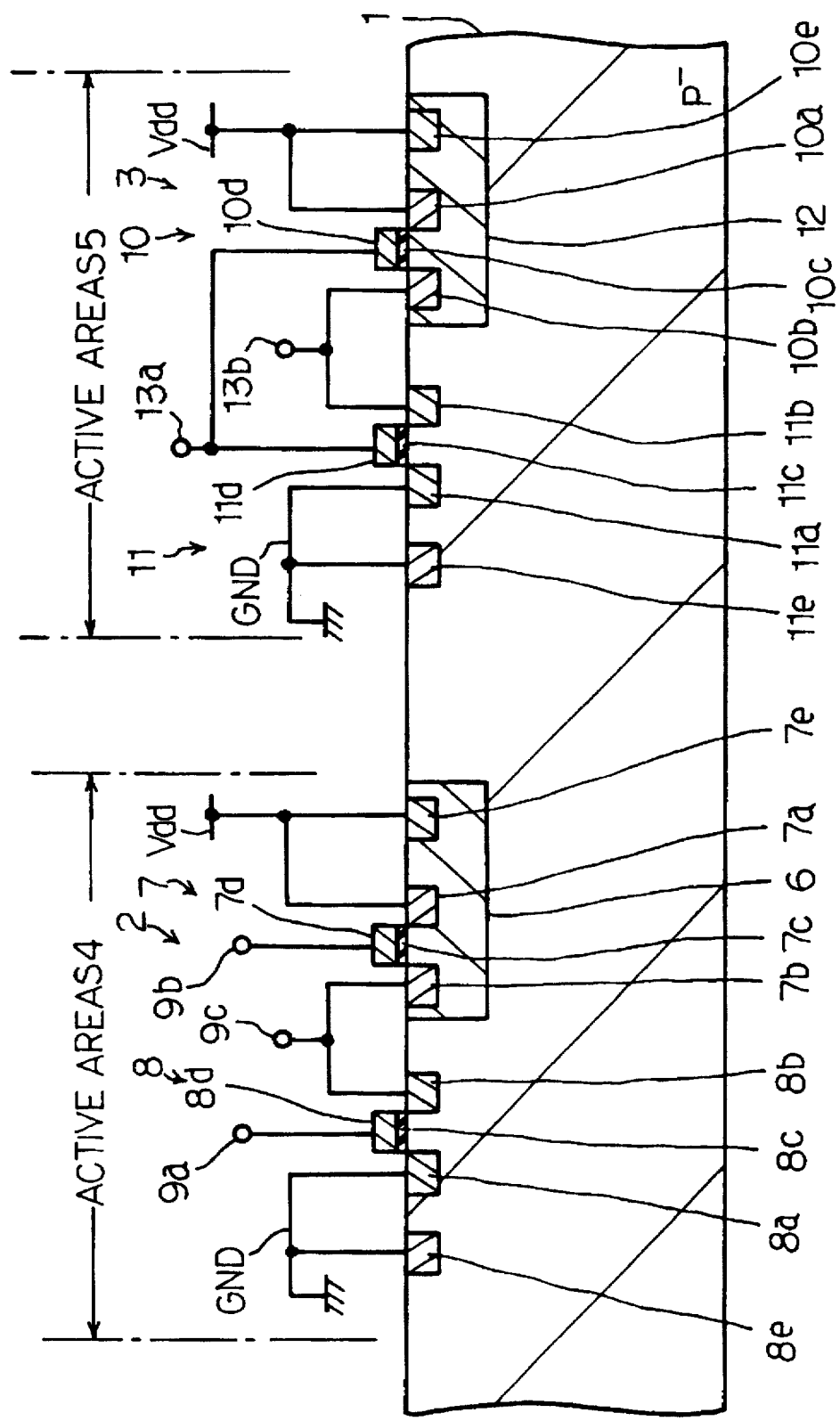
FIG. 1 is a schematic cross sectional view showing the structure of the prior art semiconductor integrated circuit device.
Figure 2:
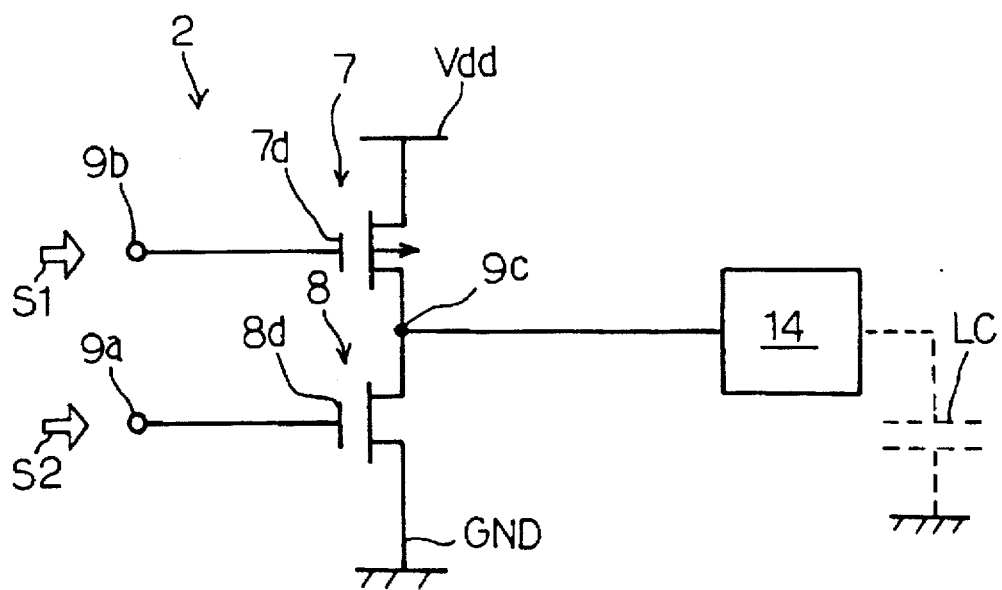
FIG. 2 is a circuit diagram showing the inverter serving as the output driver incorporated in the prior art semiconductor integrated circuit device.
Figure 3:
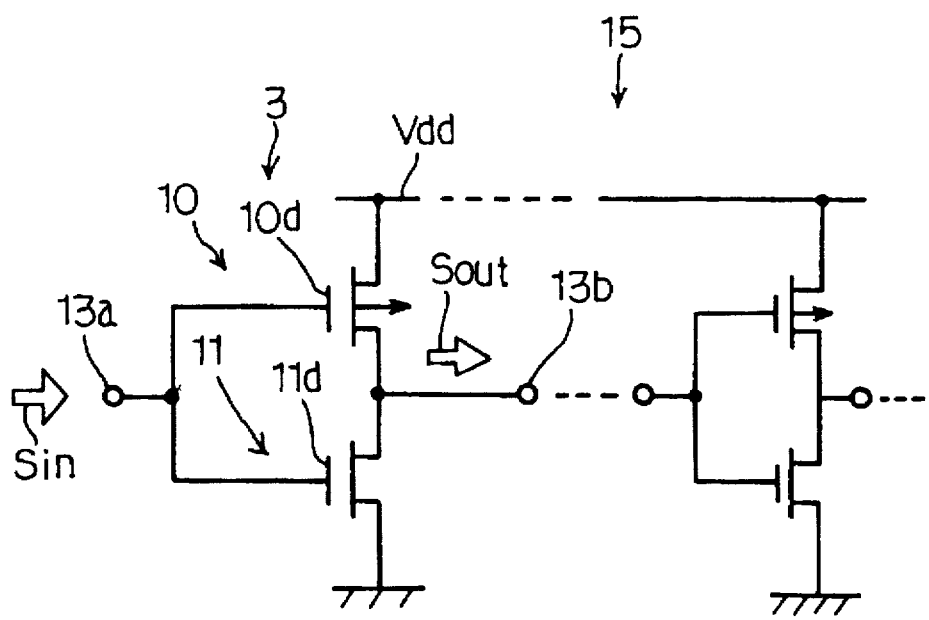
FIG. 3 is a circuit diagram showing the inverter forming a part of the logic circuit incorporated in the prior art semiconductor integrated circuit device.
Figure 4:
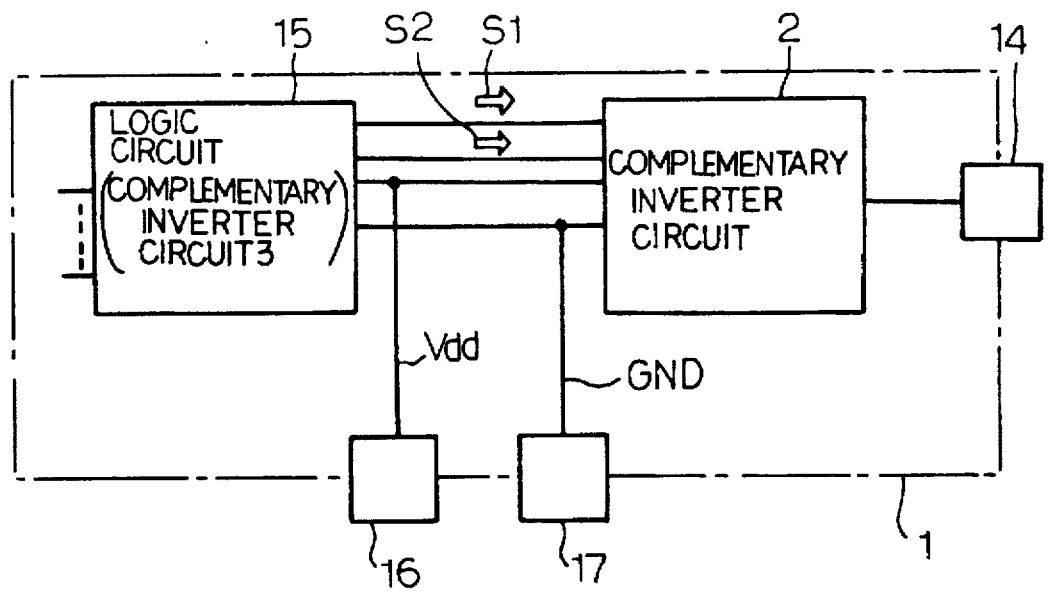
FIG. 4 is a schematic view showing the arrangement of the power supply network incorporated in the prior art semiconductor memory device.
Figure 5:
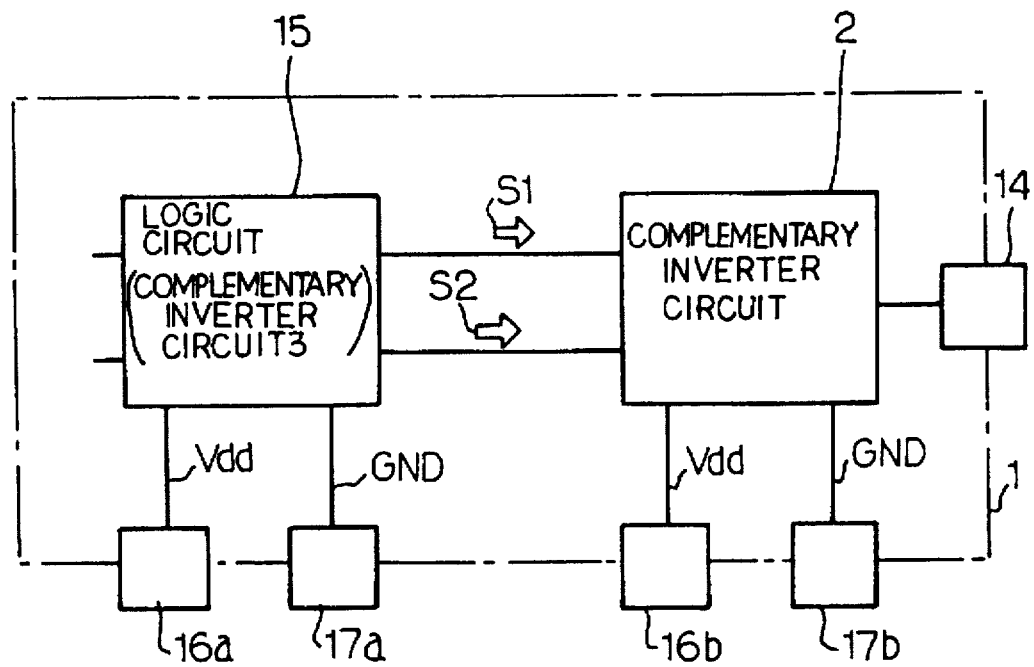
FIG. 5 is a schematic view showing the arrangement of the power supply network incorporated in another prior art semiconductor memory device.
Figure 6:
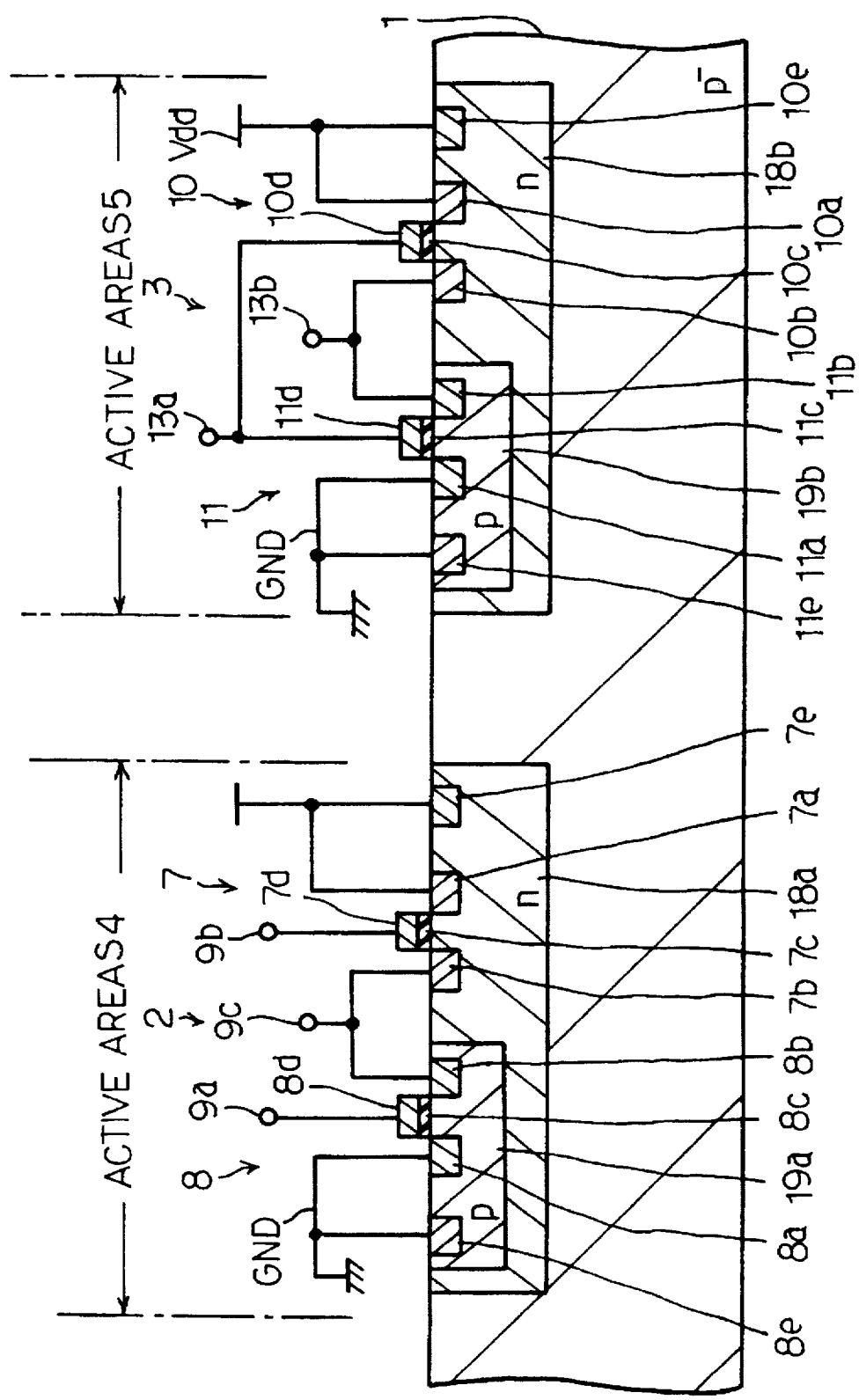
FIG. 6 is a schematic cross sectional view showing the structure of yet another prior art semiconductor integrated circuit device.
Figure 7:
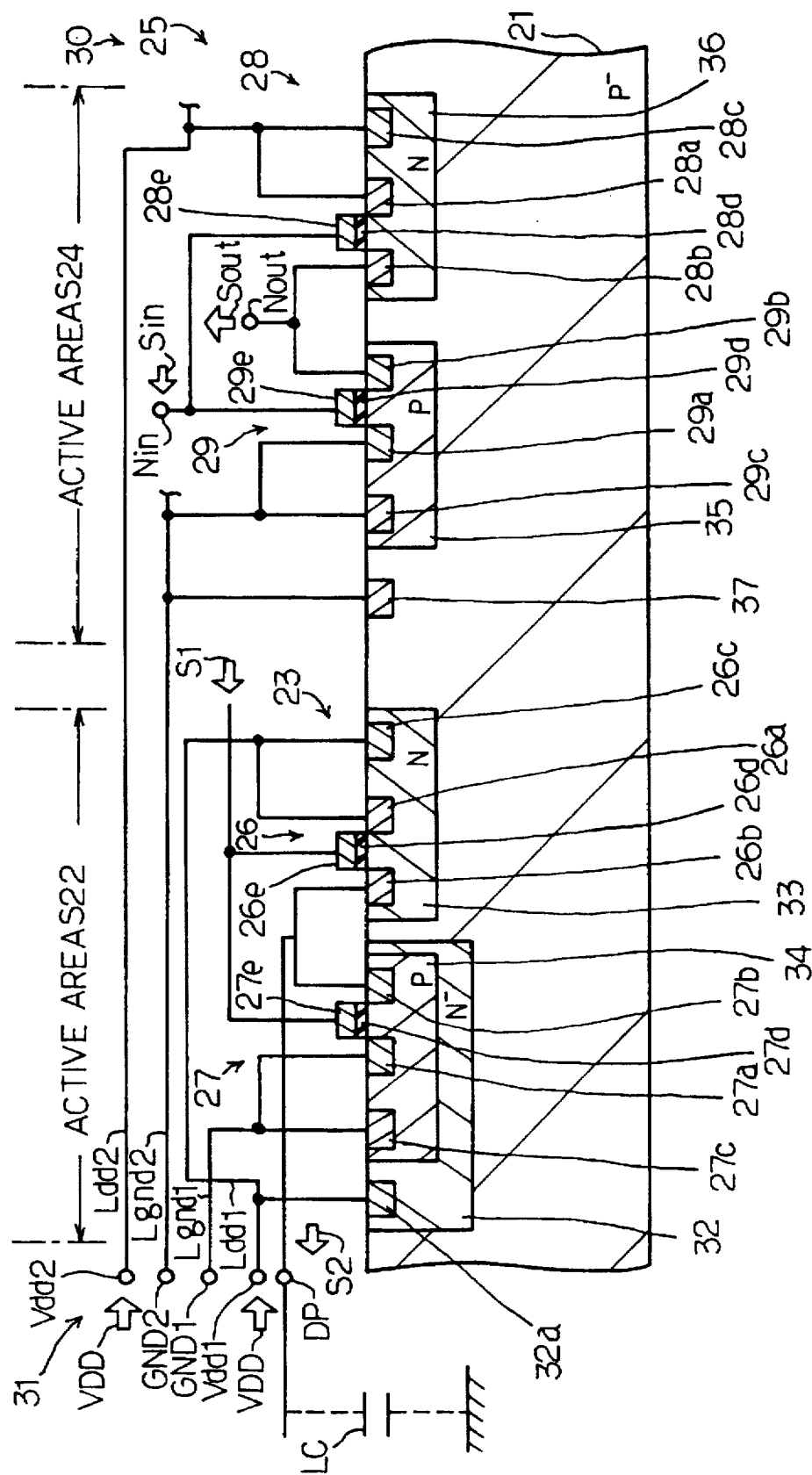
FIG. 7 is a schematic cross sectional view showing the structure of a semiconductor integrated circuit device according to the present invention.

Referring to FIG. 7 of the drawings, a semiconductor integrated circuit device embodying the present invention is fabricated on a lightly doped p-type silicon substrate 21, and a thick field oxide film (not shown) defines a plurality of active areas in the major surface of the p-type silicon substrate 21.

A pair of active areas 22 are assigned to a complementary inverter circuit 23, and another pair of active areas 24 are assigned to a complementary inverter circuit 25. The complementary inverter circuit 23 has a large-sized p-channel enhancement type field effect transistor 26 and a large-sized n-channel enhancement type field effect transistor 27, and serves as an output driver for selectively charging and discharging an external capacitive load LC.

The complementary inverter circuit 25 has a small-sized p-channel enhancement type field effect transistor 28 and a small-sized n-channel enhancement type field effect transistor 29, and forms a part of a logic circuit 30 which in turn forms a part of the semiconductor integrated circuit device.

The semiconductor integrated circuit device embodying the present invention further comprises a power supply system 31, and a positive power voltage VDD is supplied through a first power pad Vdd1 and a first power voltage line Ldd1 to the complementary inverter circuit 23 and through a second power pad Vdd2 and a second power voltage line Ldd2 to the logic circuit 30. The power supply system 31 further has first and second ground pads GND1 and GND2, and the ground voltage level is supplied from the first and second ground pads GND1 and GND2 through first and second ground voltage lines Lgnd1 and Lgnd2 to the complementary inverter circuit 23 and the logic circuit 30.

Though not shown in FIG. 7, external input data signals are supplied to the logic circuit 30, and the logic circuit 30 achieves tasks for producing an output signal S1. The output signal S1 is transferred from the logic circuit 30 to the complementary inverter circuit 23, and the complementary inverter circuit 23 produces an output data signal S2 from the output signal S1 by selectively charging and discharging the external capacitive load LC. An input signal and an output signal of the complementary inverter circuit 25 are respectively labeled with Sin and Sout.

A lightly doped n-type well 32 and an n-type well 33 are respectively formed in the active areas 22, and a p-type well 34 is formed in the lightly doped n-type well 32. The large-sized n-channel enhancement type field effect transistor 27 is assigned to the p-type well 34, and n-type source and drain regions 27a and 27b and a heavily-doped n-type contact region 27c are formed in the p-type well 34.

Over a channel region between the n-type source and drain regions 27a and 27b is formed a gate insulating film 27d on which a gate electrode 27e is provided. The n-type source region 27a and the heavily-doped n-type contact region 27c are connected with the first ground voltage line Lgnd1, and the n-type drain region 27b is connected with a data output pin DP.

A heavily doped p-type contact region 32a is formed in the lightly-doped n-type well 32, and the first power voltage line Ldd1 is connected with the heavily-doped p-type contact region 32a. Therefore, the lightly-doped n-type well 32 is biased with the positive power voltage VDD, and the p-type well 34 is biased with the ground voltage. As a result, the p-n junction between the lightly-doped n-type well 32 and the p-type well 34 is reversely biased, and electrical isolation is established between the lightly-doped n-type well 32 and the p-type well 34.

On the other hand, p-type source and drain regions 26a and 26b and a heavily doped p-type contact region 26c are formed in the n-type well 33, and the n-type source region 26a and the heavily-doped p-type contact region 26c are connected with the first power voltage line Ldd1. A gate insulating film 26d covers a channel region between the p-type source region 26a and the p-type drain region 26b, and a gate electrode 26e is provided on the gate insulating film 26d. The p-type drain region 26b is connected with the output data pin DP, and the p-channel enhancement type field effect transistor 26 and the n-channel enhancement type field effect transistor 27 selectively couple the first power voltage line Ldd1 and the first ground voltage line Lgnd1 with the output data pin DP depending upon the input data signal S1.

The first power voltage line Ldd1 biases the n-type well 33 through the heavily-doped p-type contact region 26c.

A p-type well 35 and an n-type well 36 are formed in the active areas 24, respectively, and are assigned the n-channel enhancement type field effect transistor 29 and the p-channel enhancement type field effect transistor 28, respectively.

An n-type source region 29a, an n-type drain region 29b and a heavily-doped n-type contact region 29c are formed in the p-type well 35, and a gate structure, i.e., a gate insulating film 29d and a gate electrode 29e is provided on a channel region between the n-type source region 29a and the n-type drain region 29b. The second ground voltage line Lgnd2 is connected with the n-type source region 29a and the heavily-doped contact region 29c, and the n-type drain region is connected with an output node N-out of the complementary inverter circuit 25. The gate electrode 29e is connected with an input node N-in of the complementary inverter circuit 25.

On the other hand, a p-type source region 28a, a p-type drain region 28b and a heavily-doped p-type contact region 28c are formed in the n-type well 36, and a gate insulating film 28d and a gate electrode 28e are stacked on a channel region between the p-type source region 28a and the p-type drain region 28b. The second power voltage line Ldd2 is connected with the p-type source region 28a and the heavily-doped p-type contact region 28c, and the input node Nin and the output node Nout are respectively connected with the gate electrode 28e and the p-type drain region 8b.

The complementary inverter circuit 25 thus arranged is responsive to the input signal Sin at the input node Nin, and selectively couples the second power voltage line Ldd2 and the second ground voltage line Lgnd2 with the output node N-out.

The p-type well 35 partially exposes the lightly doped silicon substrate 21 to the associated active area 24, and a heavily doped p-type contact region 37 is formed in the exposed silicon substrate 21. The heavily-doped p-type contact region 37 is connected with the second power voltage line Lgnd2, and the positive power voltage VDD biases the lightly doped silicon substrate 21.

The lightly-doped n-type well 32 and the n-type well 33 are biased with the positive power voltage VDD, and the n-type well 36 is also biased with the positive power voltage VDD. As a result, the p-n junctions between the n-type wells 32, 33 and 36 and the p-type silicon substrate 21 are reversely biased.

In this instance, the heavily-doped p-type contact regions 26c and 32a and the heavily-doped p-type contact region 37 as a whole constitute a first biasing means, and the heavily-doped p-type contact region 32a and the heavily-doped n-type contact region 27c form in combination a second biasing means.

The dualized power voltage line Ldd1/Ldd2 does not allow a voltage fluctuation or a noise on the power voltage line Ldd1 to affect the complementary inverter circuit 25, and a voltage fluctuation on the ground voltage line Lgnd1 is blocked by the lightly-doped n-type well 32.

Moreover, the n-type well 33 prevents the p-channel enhancement type field effect transistor from undesirable inversion of the output data signal S2. In detail, if complementary inverter circuit 23 discharges the large amount of current from the external capacitive load LC to the first ground line Lgnd1 or through-current flows from the first power voltage line Ldd1 into the first ground line Lgnd1, the current flowing into the first ground line Lgnd1 floats the p-type well 34, and the reversely biased p-n junction between the wells 34 and 32 floats the lightly-doped n-type well 32. However, the grounded p-type silicon substrate 21 and the p-type well 33 are less affectable by the lightly-doped n-type well 32, and the p-channel enhancement type field effect transistor 26 never turns on. As a result, the complementary inverter circuit 23 never inverts the output data signal S2.

Description is hereinbelow made on a process sequence for fabricating the semiconductor integrated circuit device according to the present invention with reference to FIGS. 8A to 8C. The process sequence starts with preparation of the lightly-doped p-type silicon substrate 21, and the lightly doped p-type silicon substrate 21 has resistivity ranging between 11 to 16 ohms-cm.

The lightly-doped p-type silicon substrate 21 is thermally oxidized so as to grow a silicon oxide film 41. An appropriate photo-resist mask (not shown) is patterned on the silicon oxide film 41, and the silicon oxide film 41 is partially etched away so as to expose a part of the lightly-doped silicon substrate 21. The photo-resist mask is stripped off after the patterning of the silicon oxide film 41.

Using the silicon oxide film 41 as a mask, phosphorus is ion-implanted into the exposed silicon substrate 21 at dose of $5 \times 10^{12}$ to $1 \times 10^{13}$ cm$^{-2}$ under the acceleration energy of 150 KeV. After the ion-implantation, the lightly-doped silicon substrate 21 is heated at 1200 degrees in centigrade for 8 hours, and the ion-implanted phosphorus is diffused into the exposed silicon substrate 21 as shown in FIG. 8A, thereby forming the lightly-doped n-type well 32 in the exposed silicon substrate 21. While the phosphorus is being diffused into the exposed silicon substrate 21, a thin silicon oxide film 42 is thermally grown.

A photo-resist mask (not shown) is patterned on the silicon oxide film 41 again, and exposes a part of the lightly-doped n-type well 32. Using the photo-resist mask, boron is ion-implanted into the exposed lightly-doped n-type well 32 at dose of $1 \times 10^{13}$ to $2 \times 10^{13}$ cm$^{-2}$ under the acceleration energy of 70 KeV. Then, a boron implanted region 43 is formed in the lightly-doped n-type well 32.

In this instance, the photo-resist mask prevents the other silicon substrate 21 covered with the silicon oxide film 41 from the ion-implantation. However, the thermally grown silicon oxide film may be partially removed by using the photo-resist mask so as to carry out the ion-implantation without the photo-resist mask.

The photo-resist mask is stripped off, and a new photo-resist mask is patterned on the silicon oxide film 41. After the patterning of the silicon oxide film 41, the photo-resist mask is stripped off. Using the new photo-resist mask, the silicon oxide film 41 is partially etched away, and the lightly-doped p-type silicon substrate 21 is partially exposed. Using the silicon oxide film 41 as a mask, phosphorus is ion implanted into the exposed silicon substrate 21 at dose of $3 \times 10^{13}$ to $4 \times 10^{13}$ cm$^{-2}$ under the acceleration energy of 150 KeV. Then, a phosphorus implanted region 44 is formed in the exposed silicon substrate 21 as shown in FIG. 8B.

The lightly-doped silicon substrate 21 is placed at high-temperature ambience at 1200 degrees in centigrade, and is maintained for 1 hours. While a furnace is heating the lightly-doped p-type silicon substrate 21, the born and the phosphorus are diffused into the lightly-doped n-type well 32 and the silicon substrate 21, and the p-type well 32 and the n-type well 33 are formed as shown in FIG. 8C.

Figure 8A:
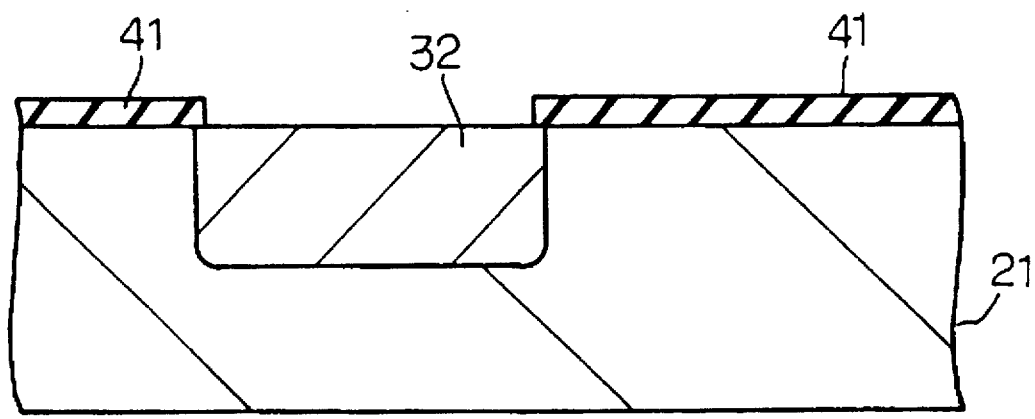
FIGS. 8A to 8C are cross section views showing essential stages of a process sequence for fabricating the semiconductor integrated circuit device according to the present invention.
Figure 8B:
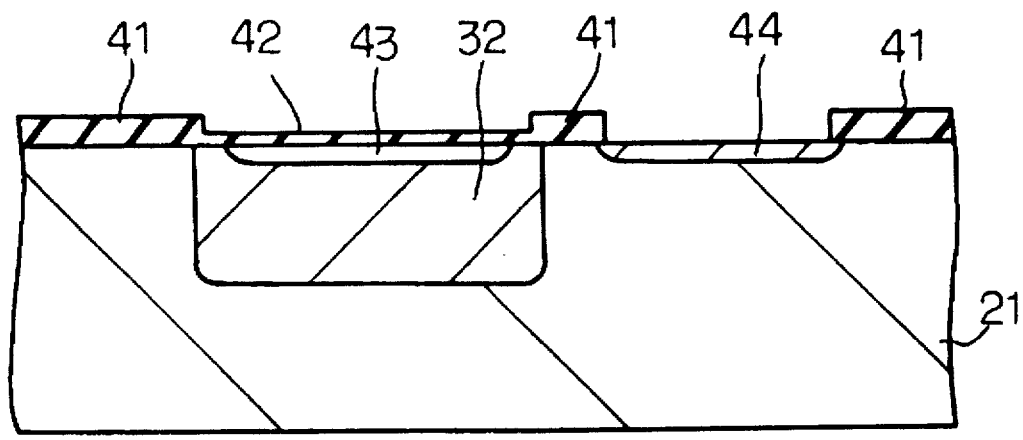
Figure 8C:
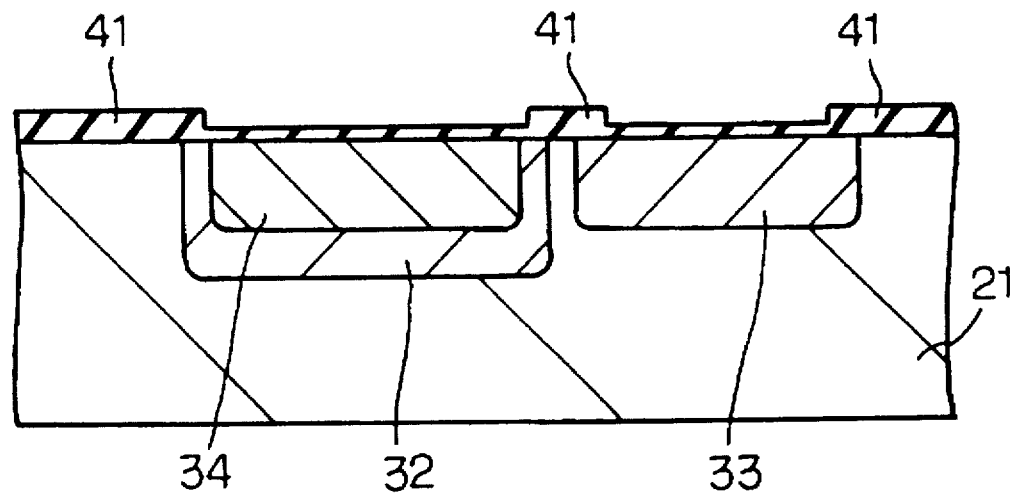

Though not shown in FIGS. 8A to 8C, the p-type well 35 and the n-type well 36 are formed in the lightly-doped silicon substrate 21 together with the p-type well 34 and the n-type well 33.

After the formation of the wells 32 to 34, the p-channel enhancement type field effect transistors 26 and 28 and the n-channel enhancement type field effect transistors 27 and 29 are sequentially fabricated on the wells 33 to 36. However, the process stages for fabricating the complementary inverter circuits 23 and 25 are well known to a person skilled in the art, and no further description is incorporated hereinbelow for the sake of simplicity.

As will be appreciated from the foregoing description, the influence of the voltage rise on the ground voltage line Lgnd1 is blocked by the n-type well 33 formed in the silicon substrate 21 separately from the lightly-doped n-type well 32, and the semiconductor integrated circuit device can drive the external capacitive load without malfunction.

Although the particular embodiment of the present invention has been shown and described, it will be obvious to those skilled in the art that various changes and modifications may be made without departing from the spirit and scope of the present invention.

What is claimed is:

1. A semiconductor integrated circuit device, fabricated on a semiconductor substrate of a first conductivity type, comprising:

a) a main circuit for producing an output data signal;
b) a complementary inverter circuit responsive to said output data signal for selectively charging and discharging an external load, and having a first field effect transistor of a first channel conductivity type formed in a first well of a second conductivity type opposite to said first conductivity type of said semiconductor substrate, said first well being formed in said semiconductor substrate, and a second field effect transistor having a second channel conductivity type opposite to said first channel conductivity type, and formed in a second well of said first conductivity type nested in a third well of said second conductivity type, said third well being formed in said semiconductor substrate and spaced from said first well;

a heavily-doped contact region formed in said semiconductor substrate, and having said first conductivity type;

a first conductor for supplying a first bias voltage to said third well to reversely bias a p-n junction formed between said third well and said semiconductor substrate;

a second conductor for supplying a second bias voltage to said first well to reversely bias a p-n junction formed between said first well and said semiconductor substrate;

a third conductor for supplying a third bias voltage to said second well to reversely bias a p-n junction formed between said second well and said third well; and a fourth conductor coupled to said heavily-doped contact region for supplying a fourth bias voltage to said heavily-doped contact region to reversely bias p-n junctions formed between said first and third wells and said semiconductor substrate.

2. The semiconductor integrated circuit device as set forth in claim 1, further comprising a power supply system comprising:

a first power supply sub-system comprising said first conductor, said second conductor, and said third conductor, said first power supply sub-system being used to supply a power voltage to said complementary inverter circuit; and a second power supply sub-system being used to supply a power voltage to said main circuit.

3. The semiconductor integrated circuit device as set forth in claim 1, wherein:

said second conductor is in contact with a first heavily-doped contact region of said first conductivity type in said first well, said first conductor is in contact with a second heavily-doped contact region of said first conductivity type formed in said third well, said third conductor is in contact with a third heavily-doped contact region of said second conductivity type formed in said second well.

4. The semiconductor integrated circuit device as set forth in claim 3, further comprising a power supply system comprising:

a first power supply sub-system comprising said first conductor, said second conductor, and said third conductor, said first power supply sub-system being used to supply a power voltage to said complementary inverter circuit; and a second power supply sub-system being used to supply a power voltage to said main circuit, and comprising said fourth conductor.

5. A semiconductor integrated circuit device comprising:

a semiconductor substrate of a first conductivity type;

an internal circuit for producing a data signal and including a first well of a second conductivity type selectively formed in said semiconductor substrate to form a first p-n junction therebetween, a second well of said first conductivity type selectively formed in said semiconductor substrate in contact therewith, said second well being adjacent to said first well, a first insulated gate transistor of a first channel type formed in said first well, and a second insulated gate transistor formed in said second well; and an output circuit responding to said data signal produced by said internal circuit to drive an external load and including a third well of said second conductivity type selectively formed in said semiconductor substrate to form a second p-n junction therebetween, a fourth well of said second conductivity type selectively formed in said semiconductor substrate adjacent to said third well and having a depth deeper than said third well to form a third p-n junction with said semiconductor substrate, a fifth well of said first conductivity type formed in said fourth well in isolation from said semiconductor substrate by said fourth well, said fifth well forming a fourth p-n junction with said fourth well, a third insulated gate transistor of said first channel type formed in said third well, and a fourth insulated gate transistor formed in said fifth well, wherein said internal circuit further includes a first conductor layer electrically connected to said first well to supply said first well with a first voltage that reversely biases said first p-n junction and a second conductor layer connected to said second well to supply a second voltage thereto, and said output circuit further includes a third conductor layer connected to said third and fourth wells to supply said third and fourth wells with a third voltage that reversely biases said second and third p-n junctions and a fourth conductor connected to said fifth well to supply said fifth well a fourth voltage that reversely biases said fourth p-n junction, wherein a fifth conductor is connected to a contact region, said contact region being formed in said semiconductor substrate, said fifth conductor supplying a fifth voltage to said contact region to reversely bias p-n junctions formed by said semiconductor substrate and said first, third and fourth wells.

6. The device as claimed in claim 5, further comprising a first pad receiving said first voltage and connected to said first conductor, a second pad receiving said second voltage and connected to said second conductor, a third pad receiving said third voltage and connected to said third conductor, and a fourth pad receiving said fourth voltage and connected to said fourth conductor.

7. The device as claimed in claim 6, wherein said first and third voltages are equal to each other and said second and fourth voltages are equal to each other, said first, second, third and fourth conductors being provided independently of one another.

8. The semiconductor integrated circuit as set forth in claim 4, in which said main circuit comprises a complementary inverter circuit having a third field effect transistor of said first channel conductivity type formed in a fourth well of said second conductivity type, said fourth well being formed in said semiconductor substrate, and a fourth field effect transistor of said second channel conductivity type formed in a fifth well of said first conductivity type, said fifth well being formed in said semiconductor substrate.

9. A semiconductor integrated circuit device including a logic circuit coupled to an output driver for selectively charging and discharging an external load, said semiconductor integrated circuit device being fabricated on a semiconductor substrate of a first conductivity type, and comprising:

first complementary inverter circuit having first and second field effect transistors operative as the output driver for selectively charging and discharging the external load;

second complementary inverter circuit having third and fourth field effect transistors forming the logic circuit;

a plurality of active areas formed on a major surface of said substrate, a first pair of active areas being assigned to said first complementary inverter circuit, and a second pair of active areas being assigned to said second complementary inverter circuit;

first, second and third wells formed within said first active areas, said third well being formed within said first well, said second field effect transistor, including source, drain, and contact regions, being assigned to and formed within said third well, and said first field effect transistor, including source, drain, and contact regions, being formed within said second well;

fourth and fifth wells formed in said second active areas and assigned to said third and fourth field effect transistors, respectively, wherein source, drain, and contact regions of said third and fourth field effect transistors are respectively formed in said fourth and fifth wells;

a heavily-doped contact region formed in an exposed surface area of said substrate; and a power supply system, including means for biasing said first, second and fourth wells with positive voltage such that junctions formed between said first, second and fourth wells and said substrate are reversely biased; means for biasing said third and fifth wells with ground voltage; and means for biasing said heavily-doped contact region with ground voltage, such that said substrate is biased via said heavily-doped contact region, wherein the junction formed by said first and third wells are electrically isolated, and wherein said logic circuit is responsive to an external input signal and produces an output signal, said output signal being supplied to said first complementary inverter circuit, which produces a second output signal to selectively charge and discharge said external load.

* * * * *

UNITED STATES PATENT AND TRADEMARK OFFICE
CERTIFICATE OF CORRECTION

PATENT NO.   : 5,714,796
DATED        : February 3, 1998
INVENTOR(S)  : Chishiki It is certified that error(s) appears in the above-identified patent and that said Letters Patent is hereby corrected as shown below:

Column 8, line 37, delete "born", and insert --boron--.

Signed and Sealed this

Twenty-third Day of June, 1998

Attest:

BRUCE LEHMAN

*Attesting Officer*     *Commissioner of Patents and Trademarks*